US010483141B2

(12) United States Patent
Janakiraman et al.

(10) Patent No.: US 10,483,141 B2
(45) Date of Patent: Nov. 19, 2019

(54) SEMICONDUCTOR PROCESS EQUIPMENT

(71) Applicant: Applied Materials, Inc., Santa Clara, CA (US)

(72) Inventors: Karthik Janakiraman, San Jose, CA (US); Hari K. Ponnekanti, San Jose, CA (US); Juan Carlos Rocha-Alvarez, San Carlos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 138 days.

(21) Appl. No.: 15/697,492

(22) Filed: Sep. 7, 2017

(65) Prior Publication Data
US 2018/0076075 A1    Mar. 15, 2018

Related U.S. Application Data

(60) Provisional application No. 62/393,420, filed on Sep. 12, 2016.

(51) Int. Cl.
*H01L 21/677* (2006.01)
*H01L 21/67* (2006.01)
*B65G 54/02* (2006.01)

(52) U.S. Cl.
CPC ........ *H01L 21/67709* (2013.01); *B65G 54/02* (2013.01); *H01L 21/6776* (2013.01); *H01L 21/67173* (2013.01); *H01L 21/67178* (2013.01); *B65G 2201/0261* (2013.01)

(58) Field of Classification Search
CPC ............ B65G 54/02; B65G 2201/0261; H01L 21/67173; H01L 21/67178; H01L 21/67709; H01L 21/6776
See application file for complete search history.

(56) References Cited

U.S. PATENT DOCUMENTS

| 9,828,192 B2* | 11/2017 | Baechle ................. B65G 54/02 |
| 10,056,279 B2* | 8/2018 | Janakiraman ..... H01L 21/67709 |
| 2012/0058630 A1* | 3/2012 | Quinn ..................... C23C 16/54 |
| | | 438/483 |
| 2013/0109189 A1 | 5/2013 | Cho et al. |
| 2013/0161183 A1 | 6/2013 | Leahey et al. |
| 2013/0287526 A1* | 10/2013 | Bluck ............... H01L 21/67739 |
| | | 414/217 |
| 2014/0377040 A1* | 12/2014 | Scollay ................ G11B 5/8404 |
| | | 414/222.13 |
| 2016/0218029 A1 | 7/2016 | Janakiraman et al. |

OTHER PUBLICATIONS

International Search Report and Written Opinion for Application No. PCT/US2017/050191 dated Dec. 19, 2017.

* cited by examiner

*Primary Examiner* — Gene O Crawford
*Assistant Examiner* — Keith R Campbell
(74) *Attorney, Agent, or Firm* — Patterson + Sheridan LLP

(57) ABSTRACT

A substrate transport system is disclosed and includes a chamber having an interior wall, a planar motor disposed on the interior wall, and a substrate carrier magnetically coupled to the planar motor. The substrate carrier comprises a base and a substrate supporting surface coupled to a support member extending from the base in a cantilevered orientation.

19 Claims, 9 Drawing Sheets

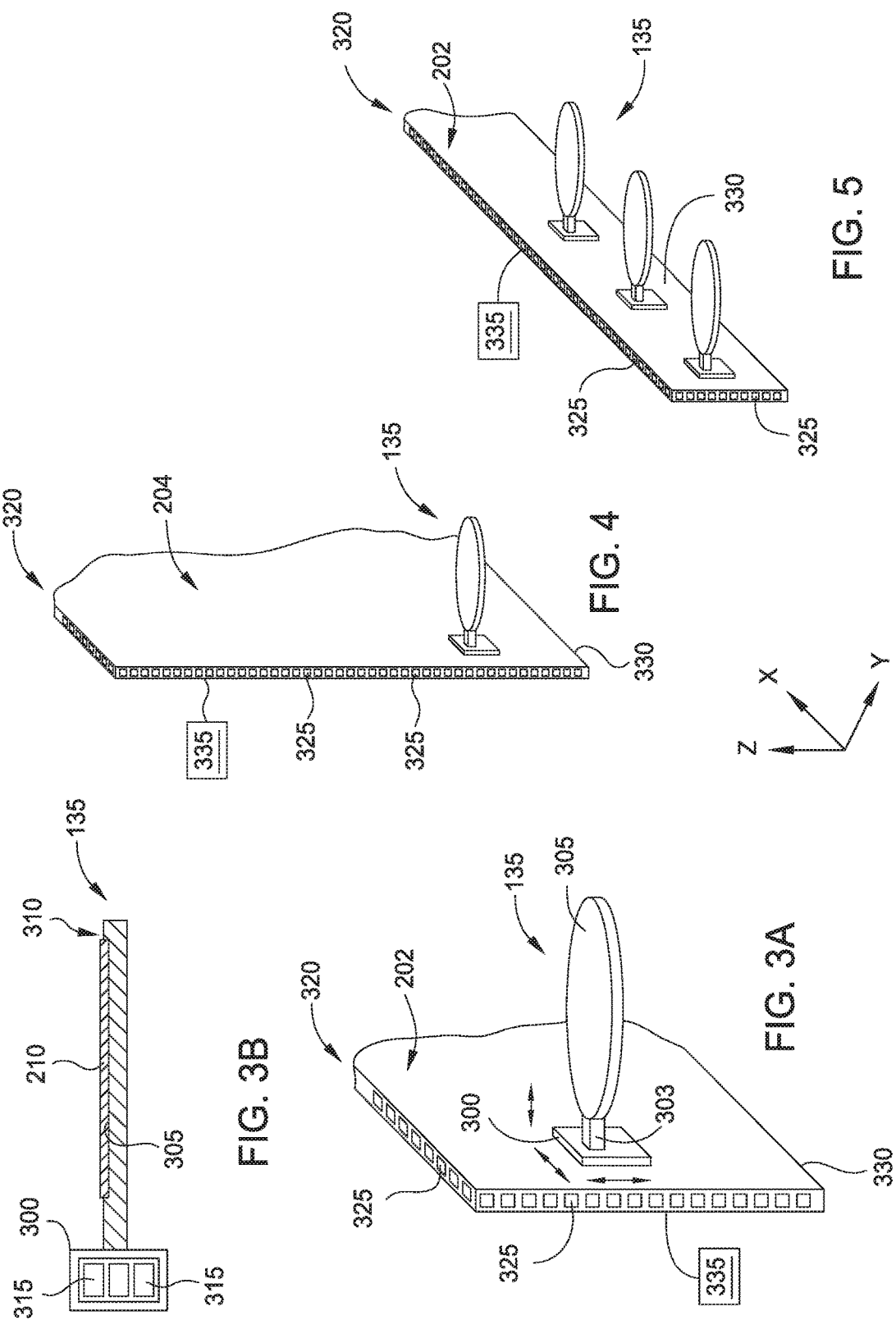

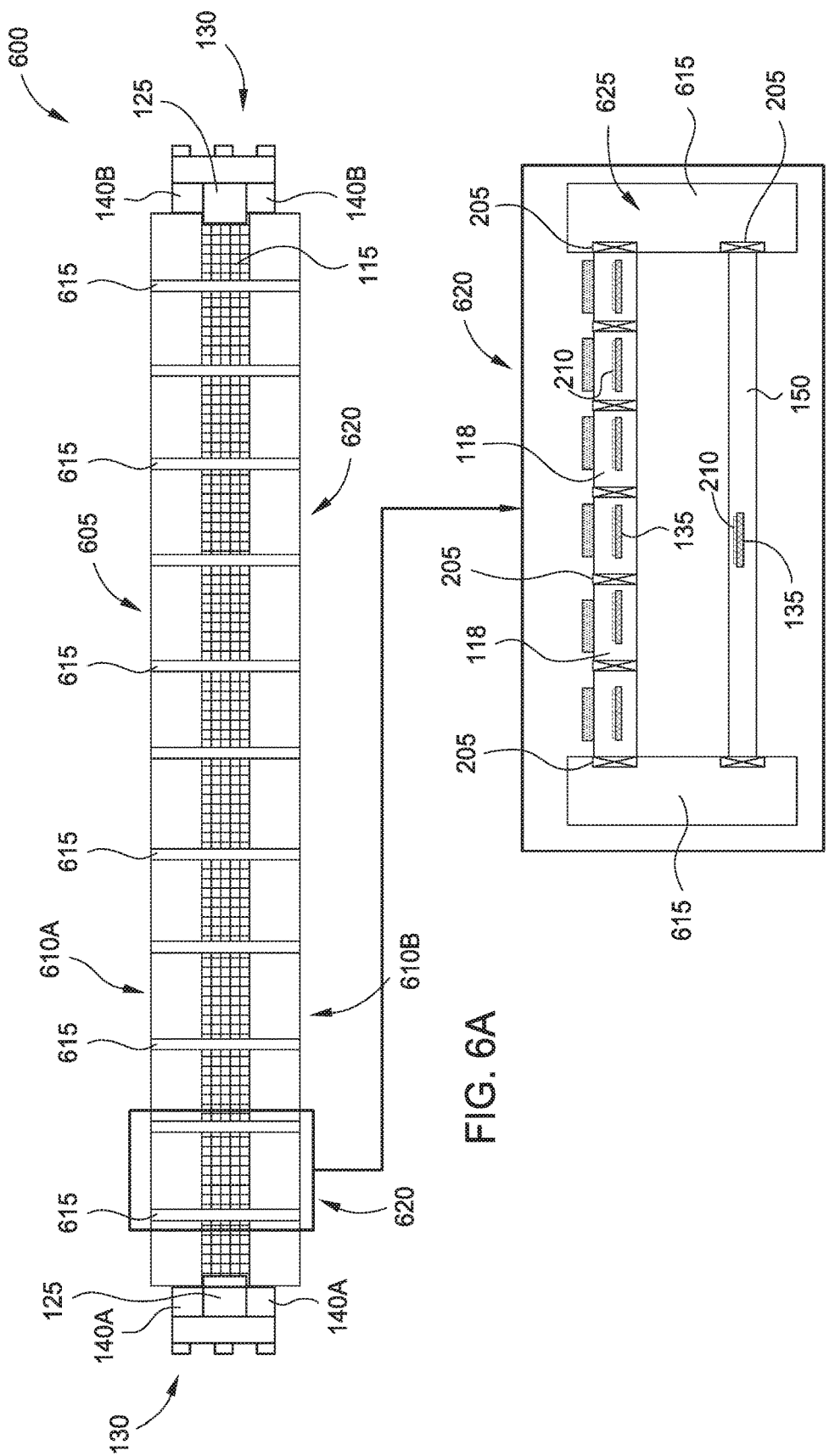

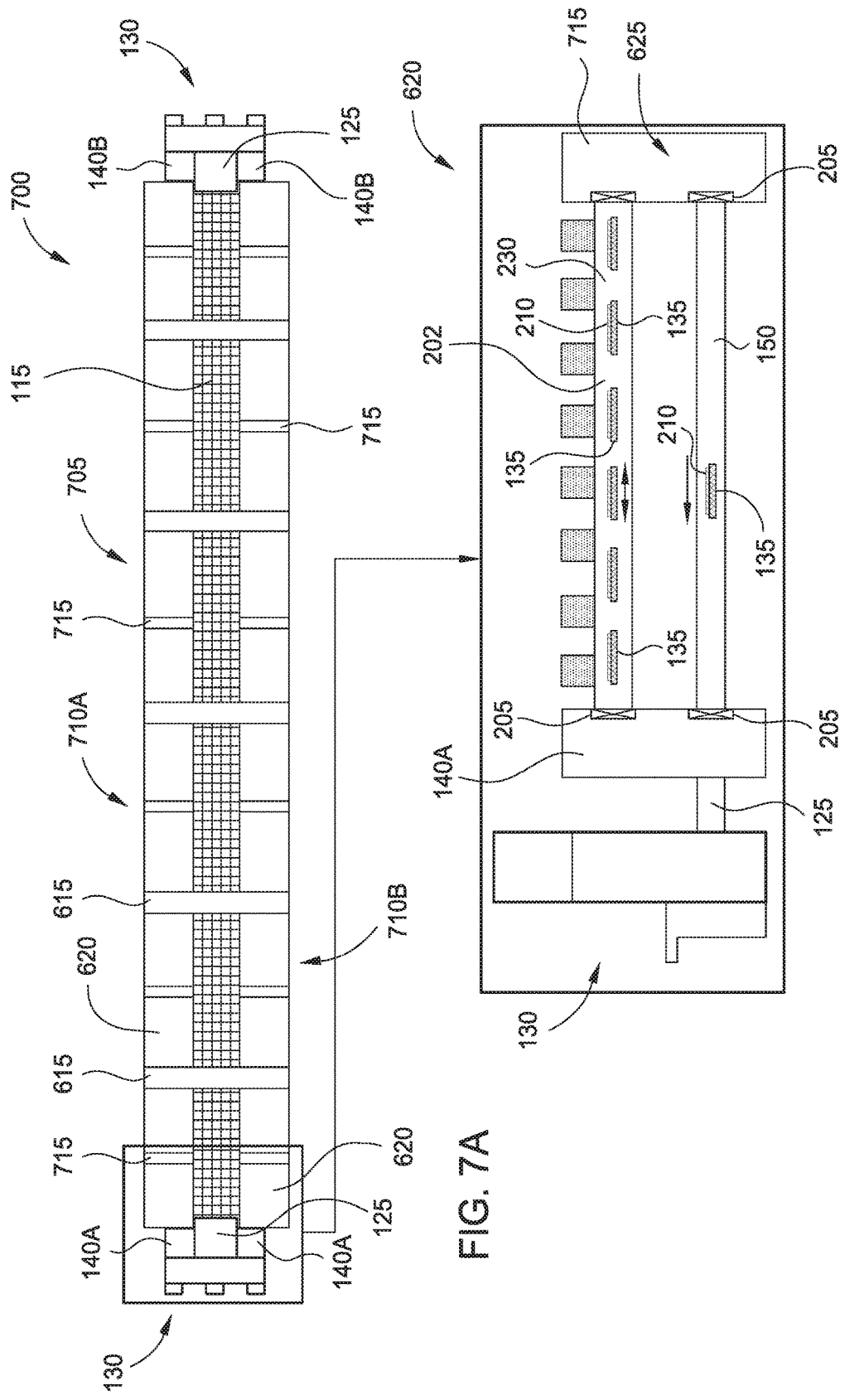

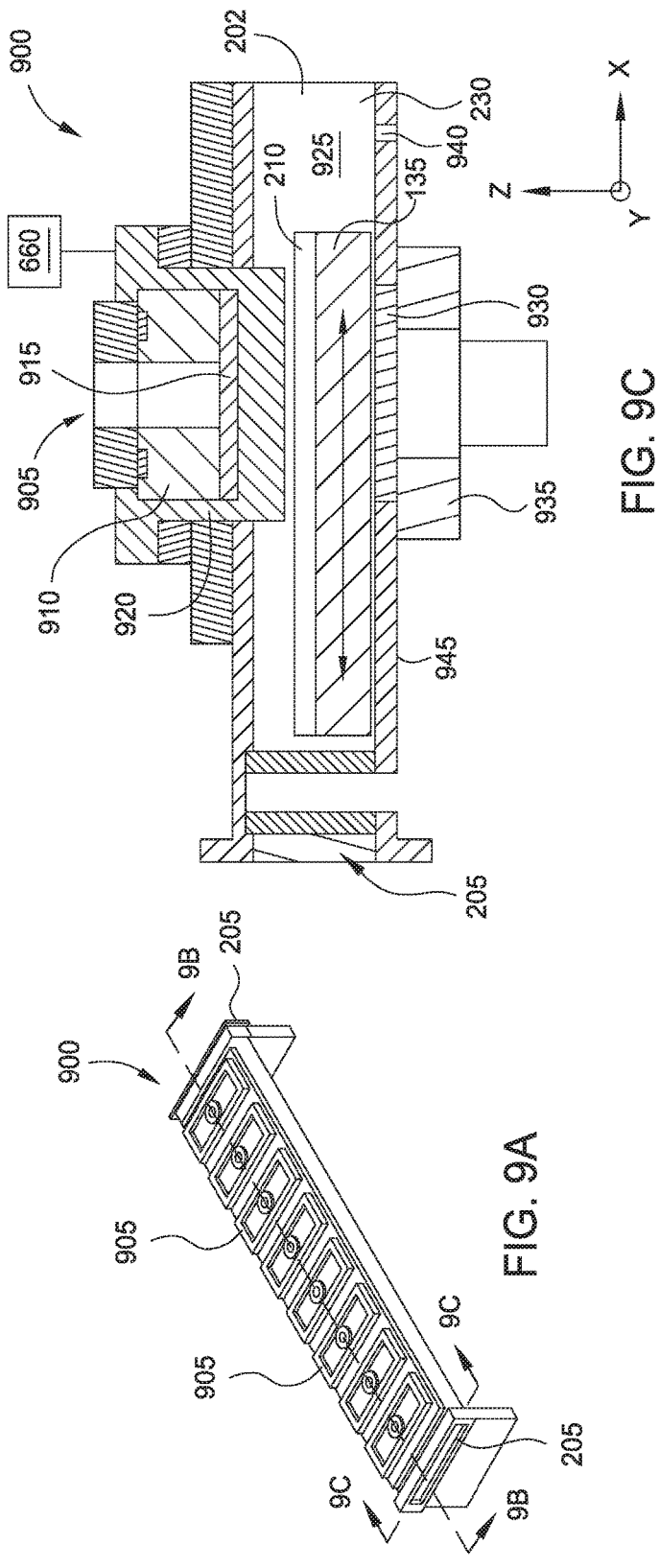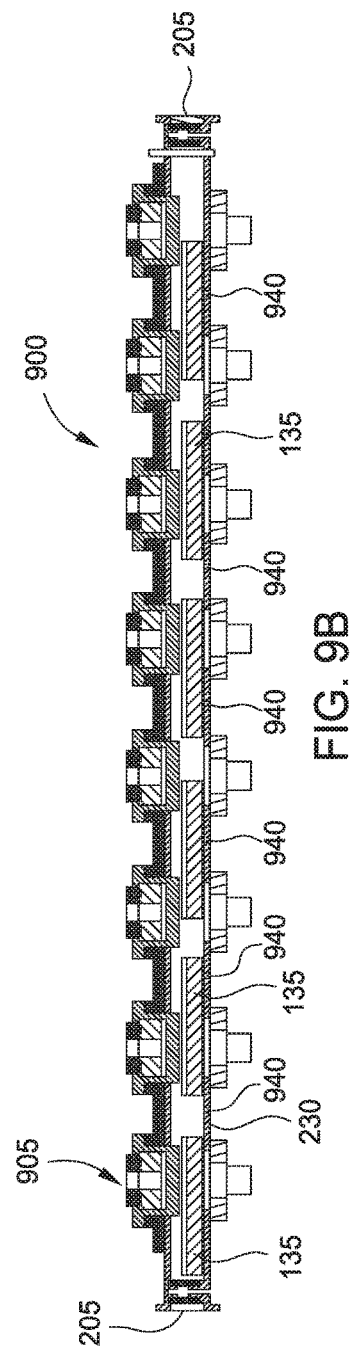

SEMICONDUCTOR PROCESS EQUIPMENT

CROSS-REFERENCE TO RELATED APPLICATION

This application claims benefit of U.S. Provisional Patent Application Ser. No. 62/393,420, filed Sep. 12, 2016, which is hereby incorporated by reference herein.

BACKGROUND

Field

Embodiments disclosed herein generally relate to semiconductor process equipment used to transfer and process substrates, such as semiconductor substrates utilized in the manufacture of electronic devices.

Description of the Related Art

Electronic devices are typically formed on semiconductor substrates using numerous process chambers, where each process chamber is used to complete one or more of the various steps (e.g., deposition, etching, annealing, among other processes) to form the electronic devices. Substrate transfer systems are typically used to move the substrates between each of the process chambers. The pressures of the process chambers can be maintained at or near vacuum. Two common arrangements used for substrate transfer systems include a cluster tool arrangement and a linear arrangement.

A substrate transfer system using a cluster tool arrangement includes a central transfer region surrounded by different process chambers. The central transfer region can be connected to a load lock chamber in order to maintain the vacuum environment within the substrate transfer system when the substrates are supplied and removed from the substrate transfer system. The central transfer region, or transfer chamber, typically includes a fixed robot that rotates about a central axis to move substrates to and from the load lock chamber as well as between the process chambers. These conventional robots are often limited to transferring only one or two substrates at a time. The conventional robots can also cause the footprint of the cluster tool to be large, due to the need for the robot to rotate and extend into and out of the process chambers. These types of conventional robots can also be a source of particles, which is undesirable.

A substrate transfer system in a linear arrangement typically includes a conveyor having a top surface with process chambers on one side (or opposing sides) of the conveyor. The conveyor can be connected to a load lock chamber in order to maintain the vacuum environment within the substrate transfer system when the substrates are supplied and removed from the substrate transfer system. One or more robots that can be positioned near each of the process chambers to transfer the substrates between the conveyor and the process chambers. The conveyors used in these linear substrate transfer systems can be a source of particle generation, which is undesirable. Additionally, the conveyors typically require regular and involved maintenance routines to assure that the conveyor is performing correctly. Furthermore, the conveyor can only be moved in one direction at a time, which can limit the movement of the substrates on the conveyor which reduces throughput.

Therefore, there is a need for an improved substrate transfer system that minimizes particle generation and footprint, as well as increasing throughput.

SUMMARY

Embodiments of the disclosure generally provide a system for transporting and/or processing a substrate. In one embodiment, the system includes a chamber having an interior wall, a planar motor disposed on the interior wall, a substrate carrier magnetically coupled to the planar motor. The substrate carrier comprises a base, and a substrate supporting surface coupled to a support member extending from the base in a cantilevered orientation.

In another embodiment, a system for processing substrates is provided including a process chamber positioned at a first level and extending between a pair of elevators, a return chamber coupled to the pair of elevators at a second level different than the first level, and a plurality of substrate carriers configured to magnetically couple to an interior wall of each of the process chamber, the elevators and the return chamber and adapted to move into and out of the process chamber.

In another embodiment, a system for processing substrates is provided including a plurality of elevators extending in a first direction, a first processing rack extending in a second direction that is orthogonal to the first direction, and a second processing rack extending in the second direction and substantially parallel to the first processing rack, wherein a service space is provided between the first processing rack and the second processing rack. Each of the processing racks comprise one or more process chambers operably coupled to the plurality of elevators, and a return chamber operably coupled to the plurality of elevators.

In another embodiment, a method for moving a substrate in a substrate transfer system is provided. The method includes placing the substrate on a substrate supporting surface of a substrate carrier, levitating and moving the substrate carrier in a first plane along a surface of a first planar motor disposed in a second plane that is orthogonal to the first plane, levitating and moving the substrate carrier into a first process chamber, and processing the substrate in the first process chamber on the substrate carrier. The levitating and moving may be provided by adjusting magnetic fields generated by coils in the first planar motor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3A is an isometric view of one embodiment of a carrier and a portion of an interior wall.

FIG. 3B is a cross-sectional view of the carrier of FIG. 3A.

FIGS. 4 and 5 are isometric views of portions of the interior wall of the elevators, and the interior wall of the process region shown in FIG. 2, respectively.

FIG. 6A is a schematic top plan view of another embodiment of a substrate fabrication tool.

FIG. 6B is a schematic cross-sectional view of one of the processing stations of the substrate fabrication tool of FIG. 6A.

FIG. 7A is a schematic top plan view of another embodiment of a substrate fabrication tool having a substrate transfer system.

FIG. 7B is a schematic cross-sectional view of one of the processing stations of the substrate fabrication tool of FIG. 7A.

FIG. 9A is a schematic isometric view of another embodiment of a chamber body.

FIG. 9B is a cross-sectional view of the chamber body along lines 9B-9B of FIG. 9A.

FIG. 9C is a cross-sectional view of a portion of the chamber body along lines 9C-9C of FIG. 9A.

To facilitate understanding, common words have been used, where possible, to designate identical elements that are common to the figures. It is contemplated that elements disclosed in one embodiment may be beneficially utilized on other embodiments without specific recitation.

DETAILED DESCRIPTION

The present disclosure relates generally to semiconductor process equipment used to transfer semiconductor substrates between process chambers. More specifically, embodiments disclosed herein are related to systems used to transfer semiconductor substrates between process chambers using a transport device that employs one or more magnetic levitation devices.

Using magnetic levitation to transport substrates between process chambers offers numerous advantages. Magnetic levitation enables designs with reduced footprint as robots, which are typically used to transfer the substrates into and out of the process chambers, can be removed in some embodiments. Reducing the footprint of a substrate transfer system can reduce the capital costs of substrate device fabrication. Reducing the footprint of a substrate transfer system can also reduce the operating and maintenance costs of the system. Reducing the size of a substrate transfer system can also reduce the costs associated with the footprint that the tool will occupy in a semiconductor fab.

Additionally, particle reduction and less contamination will be generated when using a magnetic levitation device to transport substrates, as compared to mechanical systems that have moving parts and vacuum compatible greases (which can generate particles and outgas in a vacuum environment). For example, the movement of a conventional central conveyor (or robot) to transport substrates between process chambers can generate particles. The generated particles and contamination can negatively affect product quality and in some cases reduce production yield. Alternatively, using magnetic levitation devices minimizes the amount of contact between a substrate handling tool (robot and/or conveyor) and the remainder of a substrate transfer system.

Figure 1:
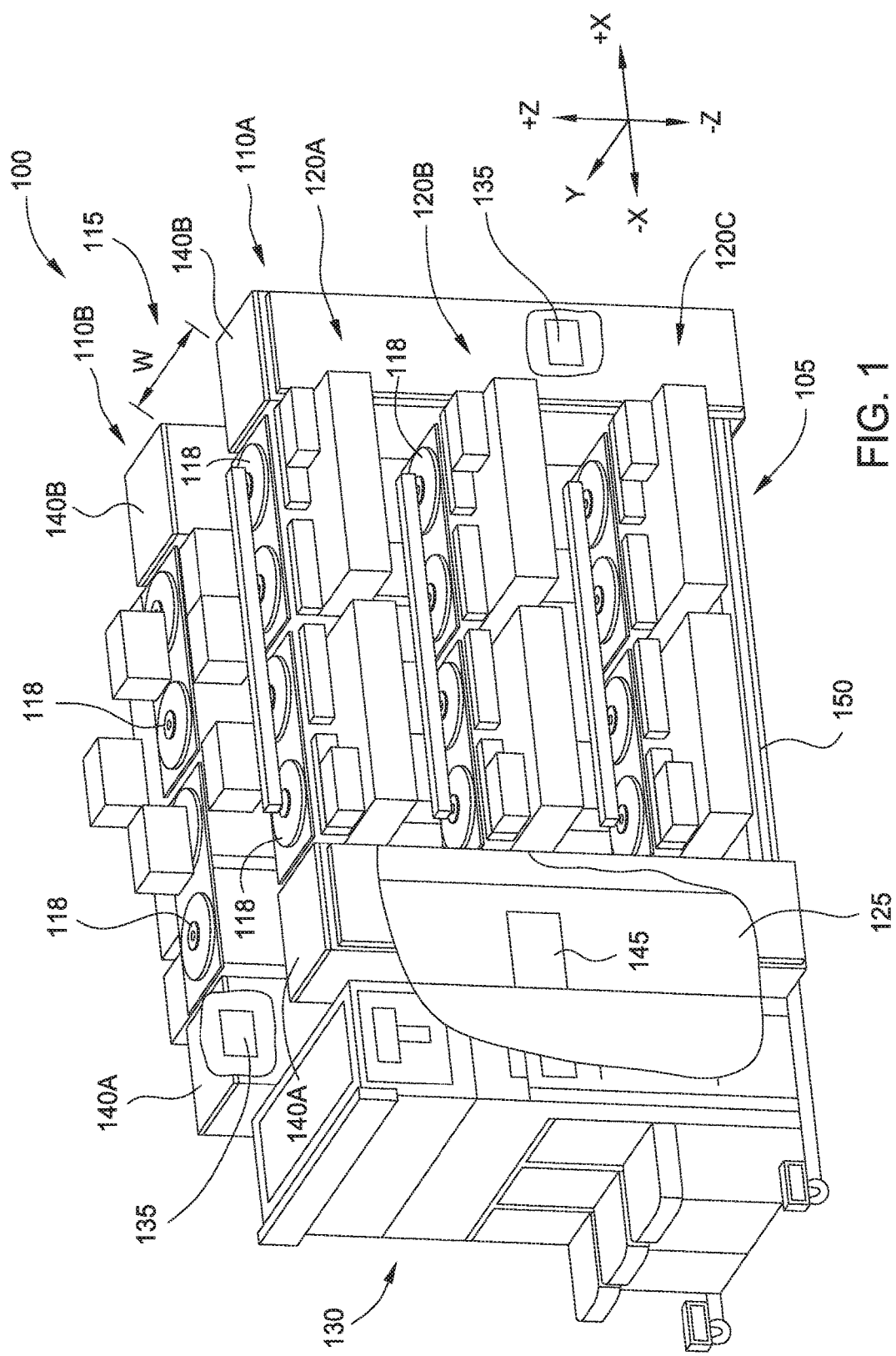
FIG. 1 is an isometric view of a one embodiment of a substrate fabrication tool showing one embodiment of a substrate transfer system.

FIG. 1 is an isometric view of a one embodiment of a substrate fabrication tool 100 having a substrate transfer system 105 according to one embodiment. The substrate transfer system 105 includes one or more linear processing racks 110A and 110B. The processing racks 110A, 110B may be separated by a service space 115 that may be utilized for maintenance. The service space 115 represents an area or volume where a transfer chamber of a conventional substrate transfer system would be positioned. However, the service space 115 includes a width dimension W that allows access to maintenance personnel when the substrate transfer system 105 is serviced.

Each of the processing racks 110A, 110B include a plurality of process chambers 118 disposed in one or more levels 120A-120C in a stacked configuration (in the Z direction). Each of the processing racks 110A, 110B are coupled to a load lock chamber 125 and a factory interface 130. The process chambers 118 in each of the processing racks 110A, 110B may be sequentially aligned in the X direction as shown. The load lock chamber 125 may be positioned in the service space 115. Substrates (not shown) are transferred through the substrate fabrication tool 100 on a plurality of carriers 135. The carriers 135 are magnetically levitated and move through the substrate transfer system 105 without contact with walls or other surfaces of the substrate transfer system 105.

Each of the carriers 135 are shown in elevators 140A, 140B coupled to opposing ends of the processing racks 110A, 110B. While only two carriers 135 are shown, the substrate transfer system 105 may include a number of carriers that exceeds the number of process chambers 118 in order to provide maximum throughput. Each of the carriers 135 is movable in at least the Z direction in the elevators 140A, 140B. However, the carriers 135 are movable within and through the process chambers 118 as well as the elevators 140A, 140B.

The process chambers 118 may be any combination of deposition chambers, etch chambers, annealing chambers, ashing chambers, or any chamber for a process utilized in electronic device fabrication. Examples of deposition chambers include chambers configured to perform chemical vapor deposition (CVD), plasma enhanced chemical vapor deposition (PECVD), physical vapor deposition (PVD), atomic layer deposition (ALD), and the like. The process chambers 118 may be configured to perform the same process or recipe, or different processes or recipes. The process chambers 118 in each processing rack 110A, 110B may be configured to process substrates in batches, or sequentially.

In operation, substrates contained in the factory interface 130 are transferred to carriers 135 in the elevators 140A, 140B through a port 145 of the load lock chamber 145 (only one port is shown in FIG. 1). The carriers 135, having a substrate thereon, are moved to the processing racks 110A, 110B and through the process chambers 118. In one example, carriers 135 move in the +Z direction to the level 120A, and the carriers 135, with a substrate retained thereon, is moved laterally from the elevator 140A to the process chambers 118 positioned on level 120A. The carriers 135, with the substrate retained thereon, are then moved laterally (+X direction) to or through each of the process chambers 118 positioned on level 120A. Each of the process chambers 118 on level 120A may perform the same process, or a different process, on a substrate disposed on a carrier 135 therein.

After processing of substrates on level 120A, the carriers 135, with substrates thereon, are moved into the elevators 140B. The carriers 135 and respective substrates are then moved in the -Z direction to level 120B. The carriers 135 are then moved laterally (-X direction) to or through each of the process chambers 118 positioned on level 120B. Each of the process chambers 118 on level 120B may perform the same process, or a different process, on a substrate disposed on a carrier 135 therein. Each of the process chambers 118 on level 120B may perform the same process, or a different process, as the process chambers 118 on level 120A.

After processing of substrates on level 120B, the carriers 135, with substrates thereon, are moved into the elevators 140A. The carriers 135 and respective substrates are then moved in the −Z direction to level 120C. The carriers 135 are then moved laterally (+X direction) to or through each of the process chambers 118 positioned on level 120C. Each of the process chambers 118 on level 120C may perform the same process, or a different process, on a substrate disposed on a carrier 135 therein. Each of the process chambers 118 on level 120C may perform the same process, or a different process, as the process chambers 118 on level 120A or 120B.

After processing of substrates on level 120C, the carriers 135, with substrates thereon, are moved into the elevators 140B. The carriers 135 and respective substrates are then moved in the −Z direction toward a return chamber 150 (only one is shown in FIG. 1). The carriers 135 are then moved laterally (−X direction) through the return chamber 150 toward the elevators 140A. When the carriers 135 are transferred to the elevators 140A, the carriers 135 may be positioned adjacent to the port 145 of the load lock chamber 125 for return of the substrates to the factory interface 130.

Figure 2:
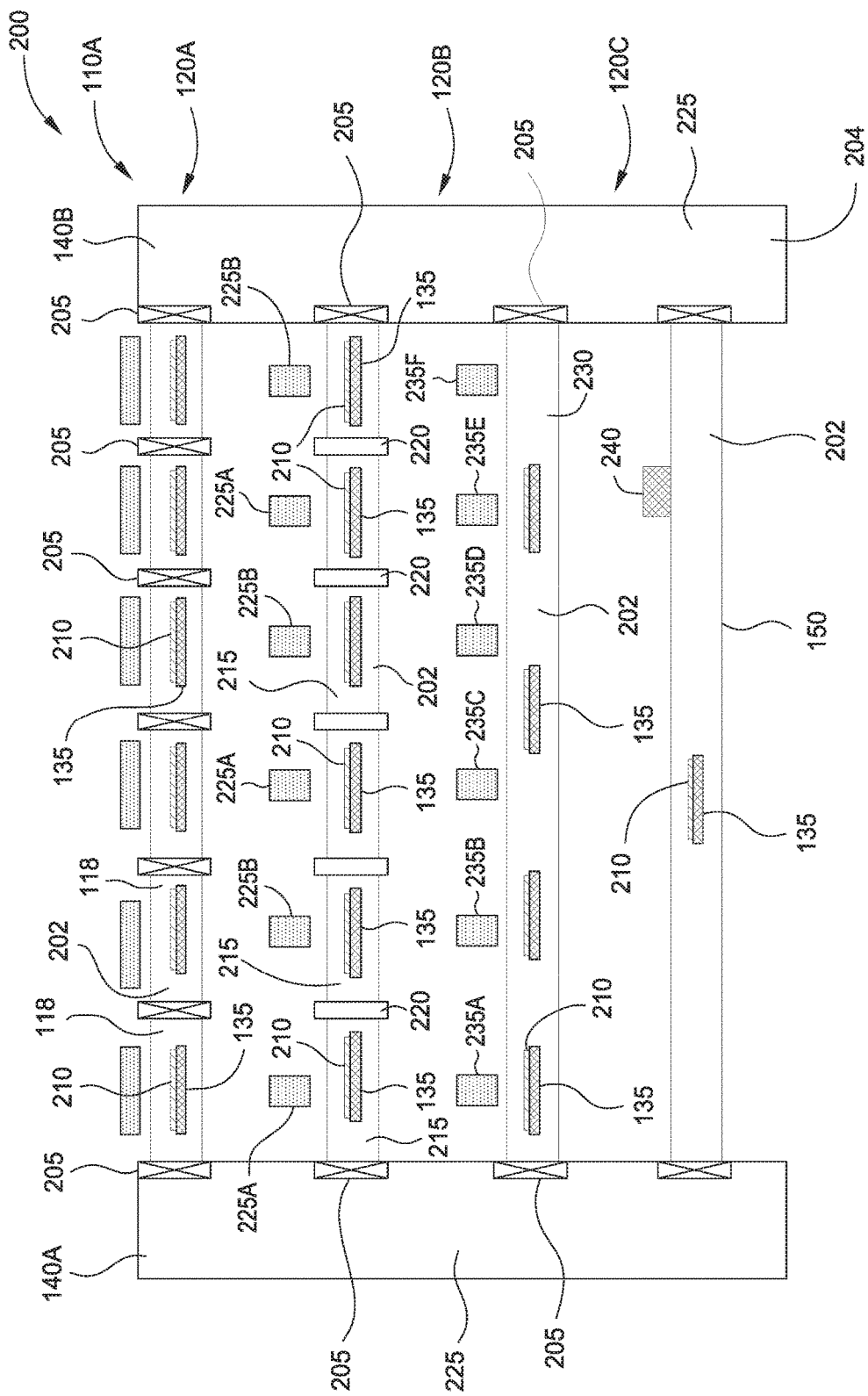
FIG. 2 is a schematic cross-sectional view of another embodiment of a substrate transfer system.

FIG. 2 is a schematic cross-sectional view of another embodiment of a substrate transfer system 200. The substrate transfer system 200 may be utilized in the substrate fabrication tool 100 of FIG. 1 as a processing rack, such as processing rack 110A. The carriers 135 according to this embodiment may be selectively stopped and moved via magnetic attraction between the respective carrier 135 and a surface of the substrate transfer system 200, such as an interior wall 202, 204, of the substrate transfer system 200.

The substrate transfer system 200 includes a plurality of process chambers 118 and the elevators 140A, 140B similar to FIG. 1. The process chambers 118 on level 120A are surrounded and separated by transfer ports 205, such as slit valves. The process chambers 118 of level 120A may be configured for single substrate processing and the transfer ports 205 separate the process volumes of each process chamber 118. Each of the carriers 135 supports a substrate 210, and each carrier 135 is indexed to move through each process chamber 118 of level 120A. The movement may be from elevator 140A to elevator 140B, or vice versa, to process substrates 210 on the carriers 135. In one configuration, the transfer ports 205 are aligned in the same plane as the process chambers 118, which saves space.

The substrate transfer system 200 also includes a plurality of process regions 215 on level 120B. Ends of the process regions 215 are separated from an interior volume 225 of the elevators 140A, 140B by transfer ports 205, such as slit valves. Adjacent process regions 215 are separated by gas curtains 220. Each gas curtain 220 may comprise a laminar flow of inert gases that effectively separates each process region 215. The process regions 215 of level 120B may be configured for spatial deposition processes on the substrates 210 which are supported on the carriers 135. For example, the process regions 215 on level 120B may include deposition sources 225A and 225B. The deposition sources 225A and 225B may be linear sources that deposit precursor A and precursor B, respectively, on substrates 210 in the respective process regions 215. Each of the carriers 135 supports the substrate 210, and each carrier is indexed to move through each process region 215 of level 120B such that precursors A and B are deposited on portions of the substrates 210. The movement may be from elevator 140A to elevator 140B, or vice versa, to process substrates 210 on the carriers 135.

The substrate transfer system 200 also includes a single process region 230 on level 120C. Ends of the process region 230 are separated from the interior volume 225 of the elevators 140A, 140B by transfer ports 205, such as slit valves. The process region 230 of level 120C may be configured for dynamic deposition processes on the substrates 210 which are supported on the carriers 135. For example, the process region 230 on level 120C may include deposition sources 235A-235F. The deposition sources 235A-235F may be linear sources that deposit different precursors on substrates 210 as the carriers 135 travel through the process region 230. The movement may be from elevator 140A to elevator 140B, or vice versa, to process substrates 210 on the carriers 135.

After substrates 210 are processed in one or all of the levels 120A-120C, the carriers 135, with the respective substrates 210 thereon, are transferred to the load lock chamber 125 and to the factory interface 130 (both shown in FIG. 1). The carriers 135, with the substrates 210 thereon, may be returned through the return chamber 150 in some configurations. In some configurations, the substrate transfer system 200 may include a metrology device 240 that may be utilized for monitoring film thickness and/or film quality on the substrates 210. The metrology device 240 may be positioned to monitor substrates as the substrates pass through the return chamber 150. The return chamber 150 may also be used for cooldown of the substrates prior to transfer to the load lock chamber 125.

One advantage of the substrate transfer system 105 and the substrate transfer system 200 is that each of substrates 210 remains on the surface of the carriers 135 in one configuration. Thus, in one configuration, each substrate 210 is effectively paired with a carrier 135 from the load lock chamber 125 (shown in FIG. 1) and during transfer through the levels 120A-120C, and de-chucked from the same carrier 135 when returned to the load lock chamber 125. For example, substrates 210 are only transferred to the carriers 135 at the load lock chamber 125 (shown in FIG. 1), and substrates 210 remain on the same carrier 135 until removal therefrom at the load lock chamber 125 after processing. This enhances efficiency by saving time that would otherwise be necessary when transferring substrates multiple times. This also minimizes moving parts, which minimizes particle generation.

FIG. 3A is an isometric view of one embodiment of a carrier 135 and a portion of an interior wall 202. The interior wall 202 may be a surface of the process chambers 118, the process regions 215 and/or the process region 230 shown in FIG. 2. FIG. 3B is a cross-sectional view of the carrier 135 of FIG. 3A.

The substrate carrier 135 includes a base 300 and a substrate supporting surface 305. A support member 303 may extend from the base in a cantilevered manner to support the substrate supporting surface 305. In some configurations, the base 300 includes a recessed area 310 (shown in FIG. 3B) where a substrate 210 may be positioned. The base 300 includes a plurality of magnets 315. In some configurations, the plurality of magnets 315 may be arranged such that they form a Halbach array or other similar configuration. The substrate carrier 135 may be formed from a non-magnetic material, such as aluminum. In some configurations of the substrate transfer system 105 or 200 it is beneficial to select the material from which the substrate carrier 135 is made to include a material that can also withstand high processing temperatures. In one example, the substrate carrier 135 is made from a ceramic material (e.g., alumina, aluminum nitride, quartz, zirconia, etc.). In some cases, the substrate carrier 135 may be coated with an electrically conductive coating to resolve any electrical charge build-up issues in or on the substrate carrier 135 during processing within the substrate transfer system 105 or 200.

FIGS. 4 and 5 are isometric views of portions of the interior wall 204 of the elevators 140A, 140B, and the interior wall 202 of the process region 230 shown in FIG. 2, respectively. Referring to FIGS. 3A, 4 and 5, the interior wall 202 and/or 204 includes a planar motor 320 having an arrangement of coils 325. The planar motor 320 may be disposed below a plate 330, such as a non-magnetic material containing plate, for example, an aluminum plate. The plate 330 separates the arrangement of coils 325 from the interior of the substrate transfer system 105 or 200. The plate 330 also allows magnetic fields, produced by the arrangement of coils 325, to interact with and control the position of the substrate carrier 135 using the plurality of magnets 315. A controller 335 and power connections (not shown) to each coil in the arrangement of coils 325 can be used to adjust the magnetic fields generated by each coil. The controller 335 may be utilized to move each substrate carrier 135 in one of more of the X, Y and Z directions as well as in one or more planes thereof. For example, each substrate carrier 135 may be moved laterally up, down or sideways, of diagonally, across the interior walls 202, 204. The controller 335 may also cause each substrate carrier 135 to stop in any location along the interior walls 202, 204.

The substrate carriers 135 are coupled to the base 300 at one end in a cantilever structure. The cantilevered arrangement of the substrate carriers 135 provides many benefits over conventional substrate carriers that are supported from a lower surface or edges thereof. Benefits include movement of a substrate 210 in the X, Y and Z directions as well as spacing the magnets 315 away from reaction zones within the process chambers 118, and the process regions 215 or 230 (shown in FIG. 2). Thus, the magnets 315 are not affected by radio frequency energy, heat, or other conditions within the process chambers 118, and the process regions 215 or 230.

In some embodiments, each coil 325 can be separated from the other coils 325 in the arrangement of coils 325 by a distance to provide consistent control of the movement and orientation of a levitated substrate carrier 135 relative to the planar motor 320. The plurality of magnets 315 in the base 300 of the substrate carrier 135 can be an array or matrix of permanent magnets positioned in a complementary arrangement to the arrangement of coils 325. The array or matrix of permanent magnets and the arrangement of coils 325 can be arrayed in a complementary orientation in the X-Y plane. In one example, the individual coils 325 within the arrangement of coils 325 are wound such that the magnetic field(s) generated when power is supplied to them interact with the generated magnetic fields created by a permanent magnet found within each of the magnets 315. The specific pattern of the magnets 315 in the substrate carrier 135 can be used to control the movement and orientation of the substrate carrier 135 relative to the fixed arrangement of coils 325.

FIG. 6A is a schematic top plan view of another embodiment of a substrate fabrication tool 600 having a substrate transfer system 605. The substrate fabrication tool 600 includes a plurality of linear processing legs 610A and 610B separated by a service space 115. The substrate fabrication tool 600 also includes a plurality of factory interfaces 130 and load lock chambers 125. The substrate fabrication tool 600 also includes elevators 140A, 140B on each end thereof as well as elevators 615 positioned between processing stations 620.

FIG. 6B is a schematic cross-sectional view of one of the processing stations 620 of the substrate fabrication tool 600 of FIG. 6A. The elevators 615 may not only function to transfer substrate carriers 135 between level 625 and the return chamber 150 as described above, but also for cross-transfer between processing legs 610A and 610B. The cross-transfer function may be useful when one or more processing stations 620 are shut down (e.g., for maintenance). Each of the processing stations 620 may include a plurality of process chambers 118 separated by transfer ports 205 as shown in FIG. 6B.

Figure 6C:
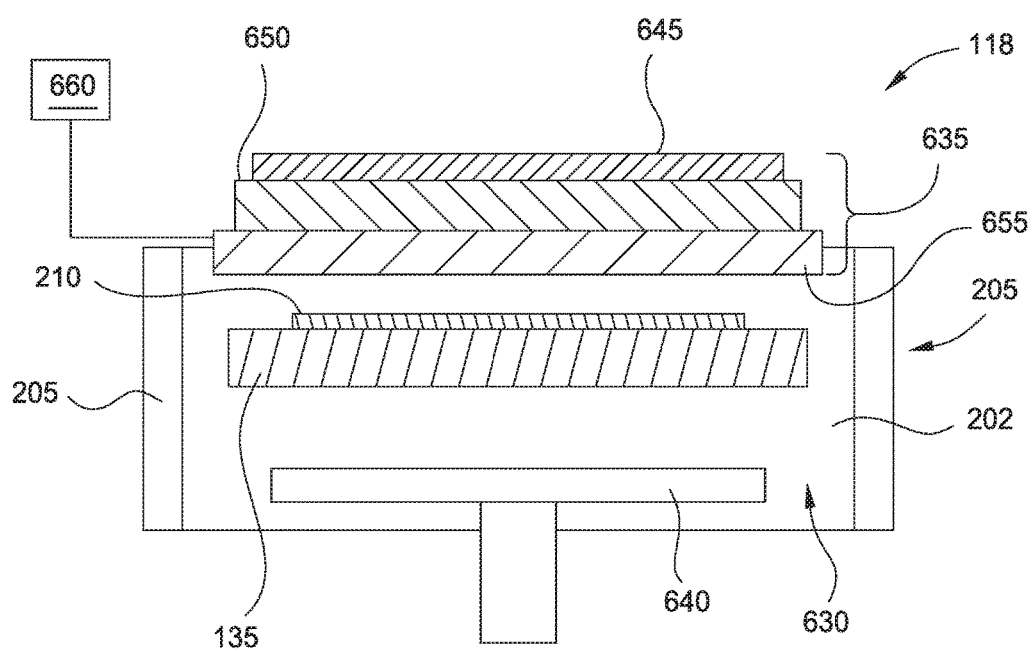
FIG. 6C is a schematic cross-sectional view of one embodiment of a process chamber that may be part of the processing stations of the substrate fabrication tool of FIG. 6A.

FIG. 6C is a schematic cross-sectional view of one embodiment of a process chamber 118 that may be part of the processing stations 620 of FIG. 6A. The process chamber 118 includes an interior volume 630 that may be bounded by sidewalls (e.g., the walls 202) and selectively sealed by the transfer ports 205. The process chamber 118 also includes a process stack 635 opposing a heater 640. The process stack 635 includes gas block 645, which is coupled to a blocker plate 650. The blocker plate 650 may be coupled to a faceplate 655, which may be a showerhead or gas distribution plate. The faceplate 655 may be coupled to a power source 660, which may be a radio frequency (RF) power source. The power source 660 may be utilized to ignite a plasma of precursor gases supplied from the gas block 645 in the interior volume 630.

FIG. 7A is a schematic top plan view of another embodiment of a substrate fabrication tool 700 having a substrate transfer system 705. The substrate fabrication tool 700 includes a plurality of linear processing legs 710A and 710B separated by a service space 115. The substrate fabrication tool 700 also includes a plurality of factory interfaces 130 and load lock chambers 125. The substrate fabrication tool 700 also includes elevators 140A, 140B on each end thereof as well as elevators 615 positioned between one or more processing stations 620. The substrate fabrication tool 700 also includes elevators 715 positioned at various intervals along a length of the substrate fabrication tool 700. In the configuration shown, the elevators 715 alternate with the elevators 615.

FIG. 7B is a schematic cross-sectional view of one of the processing stations 620 of the substrate fabrication tool 700 of FIG. 7A. The elevators 140A (as well as 140B) and the elevator 625 function to transfer substrate carriers 135 between level 625 and the return chamber 150 as described above. The elevators 615 may be utilized for cross-transfer between processing legs 710A and 710B. Each of the processing stations 620 may include the process region 230 selectively sealed at each end by transfer ports 205 as shown in FIG. 7B. The process region 230 may be configured for batch processing of a plurality of substrates 210.

Figure 7C:
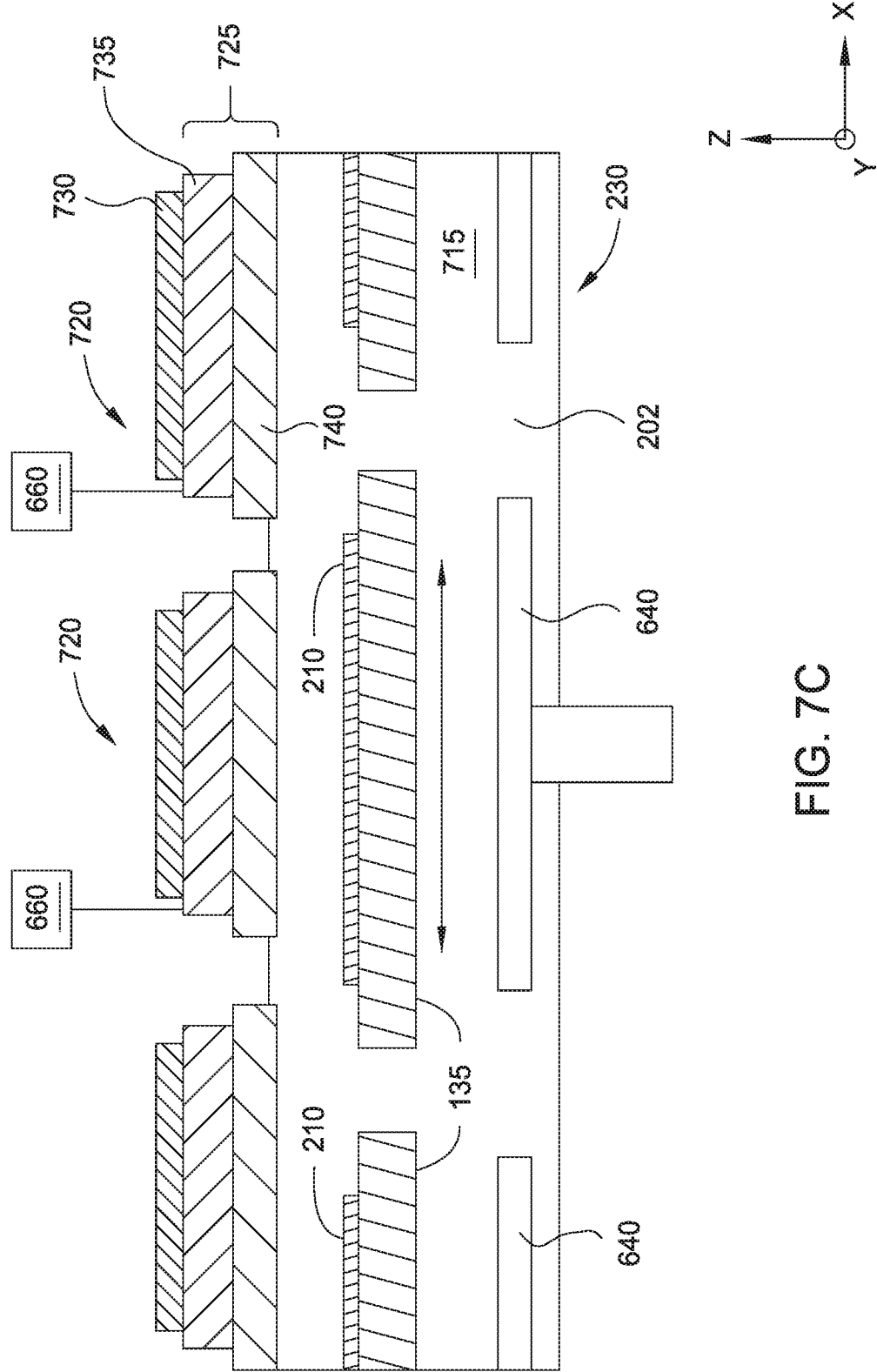
FIG. 7C is a schematic cross-sectional view of a portion of the process region of FIG. 7B.

FIG. 7C is a schematic cross-sectional view of a portion of the process region 230 of FIG. 7B. The process region 230 includes an interior volume 715 that may be bounded by sidewalls (e.g., the walls 202) and selectively sealed by the transfer ports 205 on each end thereof (shown in FIG. 7B). The process region 230 also includes a plurality of linear sources 720 and each linear source 720 opposes a heater 640. In one configuration, the linear sources 720 and heaters 640 are rectangular instead of circular. The substrate carriers 135 with substrates 210 thereon may reciprocate (move laterally relative to the linear sources 720 and heaters 640 (e.g., in the X direction and/or the Y direction)) during processing.

Each of the linear sources 720 includes a process stack 725 which may include a gas block 730, which is coupled to a blocker plate 735. The blocker plate 735 may be coupled to a faceplate 740, which may be a showerhead or gas distribution plate. The faceplate 740 may be coupled to a power source 660, which may be utilized to ignite a plasma of precursor gases supplied from the gas block 730 in the interior volume 715.

Figure 8B:
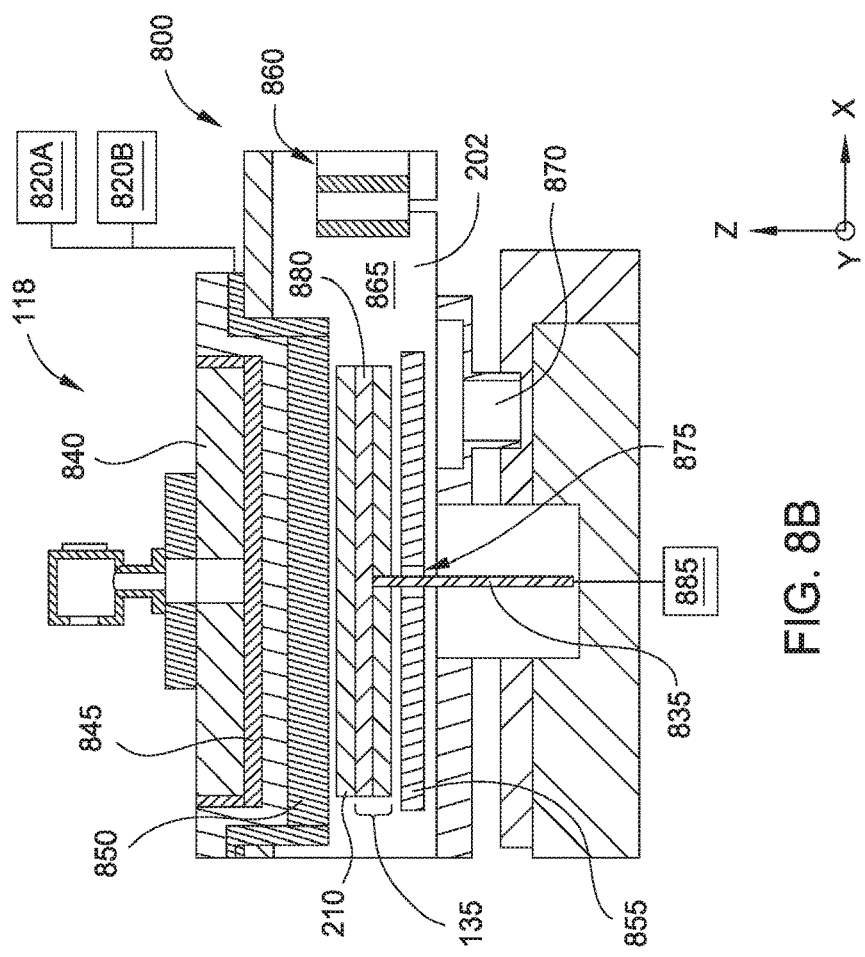
FIG. 8B is a cross-sectional view of the chamber body along lines 8B-8B of FIG. 8A showing details of a process chamber.
Figure 8A:
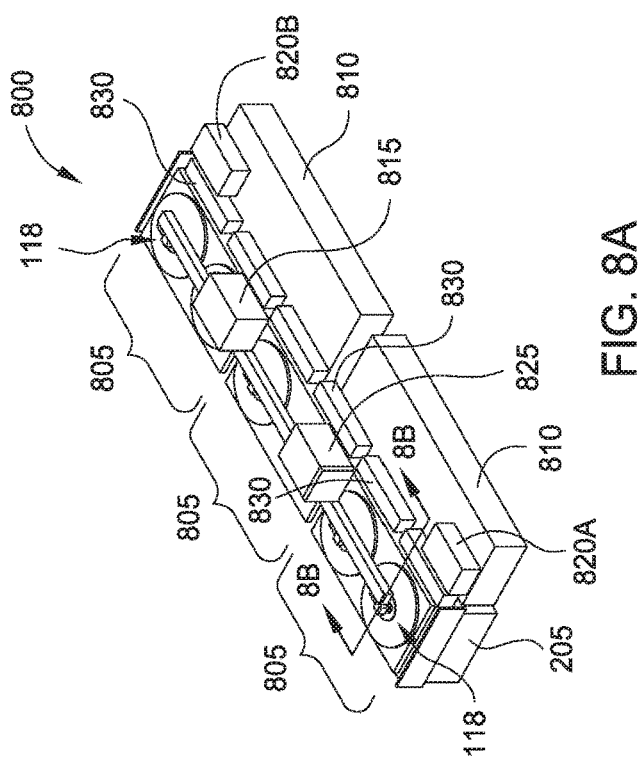
FIG. 8A is a schematic isometric view of one embodiment of a chamber body.

FIG. 8A is a schematic isometric view of one embodiment of a chamber body 800. The chamber body 800 may be utilized in the substrate fabrication tool 100 of FIG. 1, or the substrate transfer system 200 of FIG. 2 as the process chambers 118.

The chamber body 800 includes a plurality of twin chambers 805 each of which having two process chambers 118. The chamber body 800 also includes a plurality of gas panels 810. The chamber body 800 may also include a remote plasma generator 815, RF sources, such as a high frequency RF generator 820A and a low frequency RF generator 820B. The chamber body 800 may also include a RF matching unit for tuning plasma in each of the process chambers 118. Transfer ports 205 (only one is shown in FIG. 8A) are coupled to sides of the chamber body 800. In some configurations, the chamber body 800 includes a controller 830 that may control actuation of a RF applicator 835 (shown in FIG. 8B) that will be explained in greater detail below. Each of the twin chambers 805 may process two substrates simultaneously (i.e., batch) or separately.

FIG. 8B is a cross-sectional view of the chamber body 800 along lines 8B-8B of FIG. 8A showing details of a process chamber 118. The process chamber 118 includes a gas box 840, a blocker plate 845, and a faceplate 850 opposing a heater 855. An isolation valve 860 may be utilized to selectively seal a process volume 865. The isolation valve 860 may be a slit valve similar to the transfer ports 205 described above and allow substrate carriers 135 (one is shown) to pass therethrough. A pumping port 870 coupled with a vacuum pump (not shown) may be used to exhaust gases from the process volume 865. The isolation valve 860 may be utilized to isolate the process volume 865 from other process chambers 118 of the chamber body 800, or isolate twin chambers 805 from each other.

In one configuration, the heater 855 includes an opening 875 where the RF applicator 835 can contact an electrically conductive member 880 that is part of the substrate carrier 135. When the substrate carrier 135 is positioned within the process volume 865, the RF applicator 835 may be actuated by a motor 885 in the Z direction to contact the electrically conductive member 880 of the substrate carrier 135. The movement of the RF applicator 835 may be controlled by the controller 830 of FIG. 3A. Thus, the substrate carriers 135 may be utilized as a RF electrode during processing.

FIG. 9A is a schematic isometric view of another embodiment of a chamber body 900. The chamber body 900 may be utilized in the substrate fabrication tool 100 of FIG. 1, or the substrate transfer system 200 of FIG. 2 as the process region 230. The chamber body 900 includes a plurality of linear sources 905. Transfer ports 205 are coupled to sides of the chamber body 900.

FIG. 9B is a cross-sectional view of the chamber body 900 along lines 9B-9B of FIG. 9A, and FIG. 9C is a cross-sectional view of a portion of the chamber body 900 along lines 9C-9C of FIG. 9A showing the process region 230. Each of the linear sources 900 may include a gas box 910, which is coupled to a blocker plate 915. The blocker plate 915 may be coupled to a faceplate 920, which may be a showerhead or gas distribution plate. The faceplate 920 may be coupled to a power source 660, which may be utilized to ignite a plasma of precursor gases supplied from the gas box 910 in an interior volume 925 of the process region 230. The faceplate 920 opposes a heater 930 that may also function as a RF return electrode. A pumping plate 935, coupled with a vacuum pump (not shown) may be utilized to exhaust gases from the interior volume 925. Each substrate carrier 135 with a substrate 210 thereon may reciprocate (move laterally relative to the linear sources 720 and heater 930 (e.g., in the X direction and/or the Y direction)) during processing. Openings 940 may be formed in a sidewall 945 of the chamber body 900. The openings 940 may be used to flow a purge gas that may form a gas curtain between the linear sources 720.

While the foregoing is directed to embodiments of the present disclosure, other and further embodiments of the disclosure may be devised without departing from the basic scope thereof, and the scope thereof is determined by the claims that follow.

The invention claimed is:

1. A substrate transport system, comprising:
    a chamber having an interior wall;
    a planar motor disposed on the interior wall;
    a substrate carrier magnetically coupled to the planar motor, the substrate carrier comprising:
        a base;
        a substrate supporting surface coupled to a support member extending from the base in a cantilevered orientation; and
        an electrically conductive plate to apply radio frequency power to the chamber.

2. The system of claim 1, wherein the chamber comprises a plurality of process chambers.

3. The system of claim 1, wherein the chamber comprises a linear process region having a plurality of deposition sources.

4. The system of claim 1, wherein the chamber is operably coupled to an elevator having an interior wall, and a planar motor is disposed on the interior wall of the elevator.

5. The system of claim 4, wherein the elevator is operably coupled to a return chamber having an interior wall, and a planar motor is disposed on the interior wall of the return chamber.

6. A system for processing a substrate, comprising:
    a process chamber positioned at a first level and extending between a pair of elevators;
    a return chamber coupled to the pair of elevators at a second level different than the first level; and
    a plurality of substrate carriers configured to magnetically couple to an interior wall of each of the process chamber, the elevators and the return chamber, and adapted to move into and out of the process chamber, wherein the interior wall comprises a plurality of electromagnetic coils, wherein each of the plurality of substrate carriers comprise:
        a base;
        a substrate supporting surface coupled to a support member extending from the base in a cantilevered manner; and
        a radio frequency electrode.

7. The system of claim 6, wherein the process chamber comprises a plurality of process chambers.

8. The system of claim 7, wherein each of the process chambers are selectively separated by transfer ports for moving the substrate carrier therebetween.

9. The system of claim 6, wherein the process chamber comprises a process region.

10. The system of claim 9, wherein the process region is separated by one or more gas curtains.

11. The system of claim 6, wherein the interior wall of each of the process chamber, the elevators and the return chamber comprise a planar motor that interacts with one or more of the plurality of electromagnetic coils.

12. The system of claim 6, wherein the base contains one or more magnets.

13. A system for processing a substrate, comprising:
a plurality of elevators extending in a first direction;
a first processing rack extending in a second direction that is orthogonal to the first direction; and
a second processing rack extending in the second direction and substantially parallel to the first processing rack, wherein a service space is provided between the first processing rack and the second processing rack, and wherein each of the processing racks comprise:
one or more process chambers operably coupled to the plurality of elevators;
a return chamber operably coupled to the plurality of elevators; and
a plurality of substrate carriers configured to magnetically couple to an interior wall of each of the process chambers, the elevators and the return chamber and adapted to move into and out of the process chambers, wherein each of the plurality of substrate carriers comprise:
a base; and
a substrate supporting surface coupled to a support member extending from the base in a cantilevered manner; and
an electrically conductive plate to apply radio frequency power to one of the one or more process chambers.

14. The system of claim 13, further comprising:
a radio frequency applicator associated with the one of the one or more process chambers.

15. The system of claim 14, wherein the radio frequency applicator is actuated by a motor.

16. The system of claim 13, wherein the interior wall of each of the process chambers, the elevators and the return chamber comprise a planar motor.

17. The system of claim 13, wherein the one or more process chambers are selectively separated by transfer ports.

18. The system of claim 13, wherein the one or more process chambers comprise a process region.

19. The system of claim 18, wherein each of the process regions are separated by one or more gas curtains.

* * * * *